United States Patent
Merckling et al.

(10) Patent No.: US 9,947,591 B2
(45) Date of Patent: Apr. 17, 2018

(54) METHOD FOR MANUFACTURING A SI-BASED HIGH-MOBILITY CMOS DEVICE WITH STACKED CHANNEL LAYERS, AND RESULTING DEVICES

(71) Applicant: IMEC VZW, Leuven (BE)

(72) Inventors: Clement Merckling, Evere (BE); Guillaume Boccardi, Sint-Lambrechts-Woluwe (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 15/352,960

(22) Filed: Nov. 16, 2016

(65) Prior Publication Data

US 2017/0178971 A1   Jun. 22, 2017

(30) Foreign Application Priority Data

Dec. 22, 2015   (EP) .................................... 15202174

(51) Int. Cl.
*H01L 21/8238* (2006.01)
*H01L 27/06* (2006.01)
(Continued)

(52) U.S. Cl.
CPC .. *H01L 21/823807* (2013.01); *H01L 21/0265* (2013.01); *H01L 21/02639* (2013.01);
(Continued)

(58) Field of Classification Search
CPC ......... H01L 21/0265; H01L 21/823807; H01L 21/823821; H01L 27/0922; H01L 27/0924;
(Continued)

(56) References Cited

U.S. PATENT DOCUMENTS 8,324,660 B2 * 12/2012 Lochtefeld ........ H01L 21/02381
257/190
8,987,141 B2   3/2015 Zhou et al.
(Continued)

OTHER PUBLICATIONS

Czornomaz, L. et al., "Confined Epitaxial Lateral Overgrowth (CELO): A Novel Concept for Scalable Integration of CMOS-Compatible InGaAs-on-Insulator MOSFETs on Large-Area Si Substrates", 2015 Symposium on VLSI Technology Digest of Technical Papers, 2015, pp. T172-T173.

*Primary Examiner* — Yu Chen
*Assistant Examiner* — Scott Bauman
(74) *Attorney, Agent, or Firm* — McDonnell Boehnen Hulbert & Berghoff LLP

(57) ABSTRACT

A device and method for manufacturing a Si-based high-mobility CMOS device is provided. The method includes the steps of: (i) providing a silicon substrate having a first insulation layer on top and a trench into the silicon; (ii) manufacturing a III-V semiconductor channel layer above the first insulation layer by depositing a first dummy layer of a sacrificial material, covering the first dummy layer with a first oxide layer, and replacing the first dummy layer with III-V semiconductor material by etching via holes in the first oxide layer followed by selective area growth; (iii) manufacturing a second insulation layer above the III-V semiconductor channel layer and uncovering the trench; (iv) manufacturing a germanium or silicon-germanium channel layer above the second insulation layer by depositing a second dummy layer of a sacrificial material, covering the second dummy layer with a second oxide layer, and replacing the second dummy layer with germanium or silicon-germanium by etching via holes in the second oxide layer followed by selective area growth.

12 Claims, 21 Drawing Sheets

(51) Int. Cl.
  H01L 21/8258 (2006.01)
  H01L 21/02 (2006.01)
  H01L 29/66 (2006.01)
  H01L 27/092 (2006.01)
  H01L 29/06 (2006.01)
  H01L 29/423 (2006.01)
  H01L 29/786 (2006.01)

(52) U.S. Cl.
  CPC .. *H01L 21/8258* (2013.01); *H01L 21/823821* (2013.01); *H01L 27/0688* (2013.01); *H01L 27/092* (2013.01); *H01L 27/0922* (2013.01); *H01L 29/0673* (2013.01); *H01L 29/42392* (2013.01); *H01L 29/6681* (2013.01); *H01L 29/78681* (2013.01); *H01L 29/78684* (2013.01); *H01L 29/78696* (2013.01); *H01L 21/02543* (2013.01); *H01L 21/02549* (2013.01)

(58) Field of Classification Search
  CPC ........... H01L 29/0673; H01L 21/02532; H01L 21/02639; H01L 21/02543; H01L 21/02546; H01L 21/02549; H01L 21/02538; H01L 21/02524
  See application file for complete search history.

(56) References Cited

U.S. PATENT DOCUMENTS

2013/0270512 A1* 10/2013 Radosavljevic ............... H01L 21/823821 257/9
2016/0064284 A1* 3/2016 Caimi ................ H01L 21/8258 257/618
2017/0117138 A1* 4/2017 Xiao .................. H01L 21/02164
2017/0229555 A1* 8/2017 Balakrishnan ...... H01L 29/0673

* cited by examiner

METHOD FOR MANUFACTURING A SI-BASED HIGH-MOBILITY CMOS DEVICE WITH STACKED CHANNEL LAYERS, AND RESULTING DEVICES

CROSS-REFERENCE

This application claims priority to European patent application no. EP 15202174.7, filed Dec. 22, 2015, which is incorporated by reference in its entirety.

TECHNICAL FIELD

The present disclosure relates to a method for manufacturing a Si-based high-mobility CMOS device, wherein a germanium or silicon-germanium channel layer and a III-V semiconductor channel layer are co-integrated on a silicon substrate. The present disclosure relates to resulting devices which may be manufactured by means of the method.

BACKGROUND

Today, in order to boost electrical performances of CMOS devices at reduced power consumption, there is a desire to co-integrate high mobility channels such as Ge or $Si_xGe_{1-x}$ and III-V semiconductors on the same Silicon substrate, so as to obtain a high-speed Si-based CMOS having a high electron mobility characteristic of the Group III-V semiconductor and a high hole mobility characteristic of Ge or $Si_xGe_{1-x}$.

U.S. Pat. No. 8,987,141 refers to a method of manufacturing a Si-based high-mobility Group III-V/Ge channel CMOS device. The resulting device has nMOS and pMOS devices side by side, i.e. in horizontal direction.

In L. Czornomaz et al., "Confined Epitaxial Lateral Overgrowth (CELO): A Novel Concept for Scalable Integration of CMOS-compatible InGaAs-on-insulator MOSFETs on Large-Area Si Substrates", 2015 Symposium on VLSI Technology Digest of Technical Papers, pp. T172-T173, the authors refer to a CMOS-compatible integration of high-quality InGaAs on insulator (InGaAs-OI) on Si substrates. The starting point is to define a seed area to the Si substrate in a thermal oxide, from which the InGaAs material will grow. Unlike classical epitaxial lateral overgrowth, the growth is geometrically constrained in a cavity that is defined by a sacrificial layer. The final InGaAs geometry, thickness and roughness are hence defined by the morphology of the sacrificial layer rather than by lithography or chemical mechanical polishing. The shape of the cavity implies that defect filtering occurs at the seed region of the structure due to an abrupt change of the growth direction from vertical to lateral. Propagating defects are therefore blocked in 2D.

SUMMARY OF THE DISCLOSURE

It is an aim of the present disclosure to provide a method for manufacturing a Si-based high-mobility CMOS device, wherein a Ge channel layer and a III-V semiconductor channel layer can be co-integrated on a silicon substrate, in particular stacked above each other, so that they can have a more efficient layout.

This aim is achieved according to the disclosure with the method comprising the steps of the first independent claim.

It is another aim of the present disclosure to provide a Si-based high-mobility CMOS device, wherein a Ge or $Si_xGe_{1-x}$ channel layer and a III-V semiconductor channel layer can be co-integrated on a silicon substrate and which has a more efficient layout.

This other aim is achieved according to the disclosure with the device of the second independent claim.

In an aspect, this disclosure provides a method for manufacturing a Si-based high-mobility CMOS device, wherein a Ge or $Si_xGe_{1-x}$ channel layer and a III-V semiconductor channel layer can be co-integrated on a silicon substrate, the method comprising the steps of:

a) providing a silicon substrate having a first insulation layer (e.g. STI) on top and a trench extending through the insulation layer and into the silicon;

b) manufacturing a III-V semiconductor channel layer above the first insulation layer by means of, in sequence, depositing a first dummy layer of a sacrificial material above the first insulation layer and in the trench, covering the first dummy layer with a first oxide layer, and replacing the first dummy layer with III-V semiconductor material by etching the sacrificial material via holes made in the first oxide layer followed by selective area growth with the III-V semiconductor material (e.g. GaP, $In_xGa_{(1-x)}P$, InP, GaAs, $In_xGa_{(1-x)}As$, InAs, GaSb, $In_xGa_{(1-x)}Sb$, InSb);

c) manufacturing a second insulation layer on top of the III-V semiconductor channel layer and uncovering the trench;

d) manufacturing a germanium or silicon-germanium channel layer above the second insulation layer by means of, in sequence, depositing a second dummy layer of a sacrificial material above the second insulation layer and in the trench, covering the second dummy layer with a second oxide layer, and replacing the second dummy layer with germanium or silicon-germanium by etching the sacrificial material via holes made in the second oxide layer followed by selective area growth with germanium or silicon-germanium.

Both the n/p channels can in subsequent steps be etched into different configurations: fins, sheets, nanowires, and separated by oxide layers. Standard CMOS processing can be used to manufacture source, drain and gate structures, such that for example in each fin an nMOS device and a pMOS device can be obtained which are stacked above each other and which are separated from the adjacent fins, i.e. there are separate, individual nMOS and pMOS devices in each fin. The structures obtainable by means of the steps described herein could drastically improve the electrostatic properties of the manufactured devices. Moreover, the stacked configuration of the structures can strongly improve the layout efficiency by having both n/p channels aligned in the vertical direction, i.e. stacked individual nMOS and pMOS devices, such that the critical dimension of the structures becomes vertical rather than horizontal.

In the method according to this disclosure, selective area growth (SAG), also known as selective area epitaxy, can be used to grow the III-V semiconductor and (silicon-) germanium channel layers starting from an exposed seed area in the silicon substrate. The same seed area (the trench) can be used for both channel layers, which improves layout efficiency. Selective area growth or selective area epitaxy is commonly known to the person skilled in the art as the local growth of epitaxial layer through a patterned dielectric mask (typically $SiO_2$ or $Si_3O_4$). The CELO technique described above is an example of SAG and can also be used in embodiments of the method according to this disclosure.

In embodiments according to the present disclosure, the size and location of the first and second holes may be chosen such that the first and second oxide layers have cover parts which force lateral growth during the selective area growth steps. In this way the defective parts of the grown layers can be restricted to the area of the trench.

In embodiments according to the present disclosure, the holes used for etching away the first and second dummy layers preferably comprise sets of holes which are offset from the location of the trench by a predetermined distance. This way, a stacked structure with layers of uniform thickness can be achieved between the location of the trench and the location of the holes.

In embodiments according to the present disclosure, the holes used for etching away the first and/or second dummy layers may also comprise non-offset holes aligned with the location of the trench. The aligned holes are preferably of smaller size than the offset holes. These aligned holes can function to support etching away the sacrificial material from the trench, especially in the steps for manufacturing the higher channel layer.

In embodiments according to the present disclosure, the trench may have slanting side planes in the silicon substrate, i.e. a bottom shape with slanting side planes such as a V-groove shape composed of {111} Si planes. It has been found that this can improve the epitaxial quality during Si/Ge/III-V selective area growth.

In embodiments according to the present disclosure, the III-V semiconductor channel layer and the silicon-germanium channel layer may be switched, e.g. in function of $Si_xGe_{1-x}$ stoichiometry, i.e. for $Si_xGe_{1-x}$ with x>0.5, the $Si_xGe_{1-x}$ channel layer may be manufactured first with the III-V semiconductor channel layer being manufactured above the silicon-germanium layer. However for $Si_xGe_{1-x}$ with x=<0.5, the $Si_xGe_{1-x}$ channel layer may be manufactured second with the III-V semiconductor channel layer being manufactured below the silicon-germanium layer.

BRIEF DESCRIPTION OF THE DRAWINGS

The disclosure will be further elucidated by means of the following description and the appended figures.

DETAILED DESCRIPTION OF THE DISCLOSURE

Figure 1:
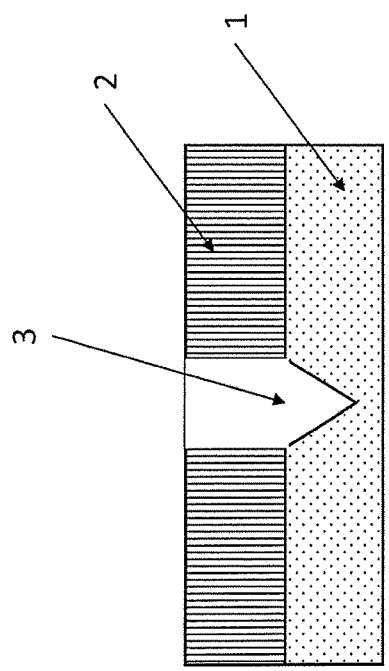
FIGS. 1-19 show an embodiment according to the present disclosure of a method for manufacturing a Si-based high-mobility CMOS device, wherein a Ge or $Si_xGe_{1-x}$ channel layer and a III-V semiconductor channel layer are co-integrated on the same silicon substrate.
Figure 1:
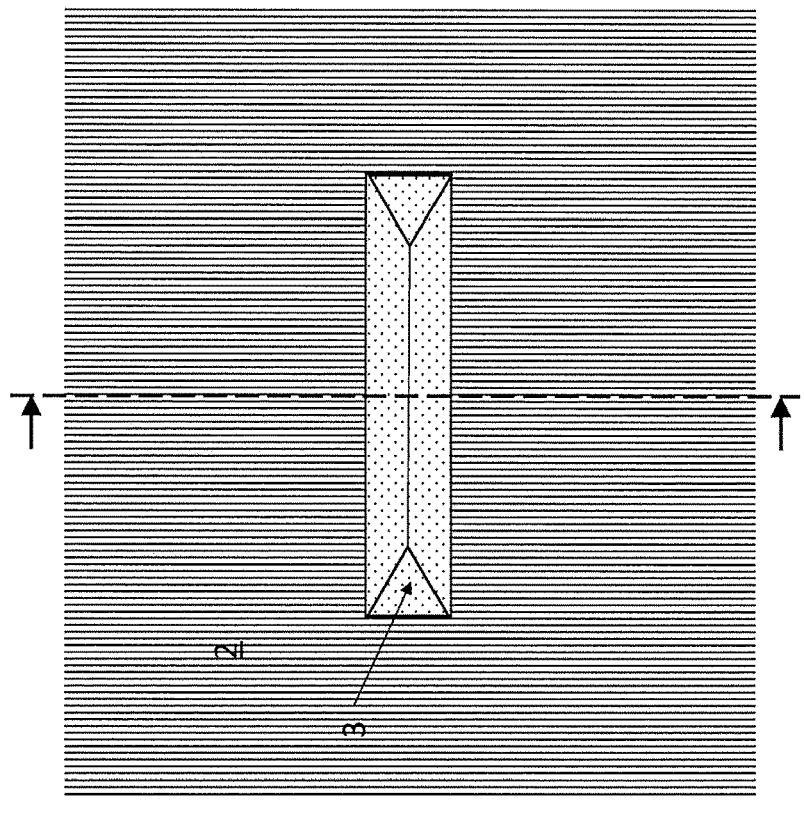

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the disclosure.

Furthermore, the terms first, second, third and the like in the description and in the claims, are used for distinguishing between similar elements and not necessarily for describing a sequential or chronological order. The terms are interchangeable under appropriate circumstances and the embodiments of the disclosure can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the disclosure described herein can operate in other orientations than described or illustrated herein.

Furthermore, the various embodiments are to be construed as exemplary manners in which the disclosure may be implemented rather than as limiting the scope of the disclosure.

The term "comprising", used in the claims, should not be interpreted as being restricted to the elements or steps listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising A and B" should not be limited to devices consisting only of components A and B, rather with respect to the present disclosure, the only enumerated components of the device are A and B, and further the claim should be interpreted as including equivalents of those components.

Today, in order to boost electrical performances of CMOs devices at reduced power consumption, there is a desire to co-integrate high mobility channels such as Ge or $Si_xGe_{1-x}$ and III-V semiconductors on the same Silicon substrate. Herein a new integration flow is presented in order to stack Ge or $Si_xGe_{1-x}$ and III-V channels onto a Si substrate. Both n/p channels can be later on etched into different configurations: fins, sheets, wires and separated by oxide layers. The obtainable structures could drastically improve the electrostatic properties of the manufactured devices. Moreover, the stacked configuration of the device may improve the layout efficiency by having both n/p channel aligned in the vertical direction. This can be highly efficient for example for CMOS inverters and SRAM cells.

FIGS. 1-19 show an embodiment according to the present disclosure of a method for manufacturing a Si-based high-mobility CMOS device, wherein a Ge or $Si_xGe_{1-x}$ channel layer and a III-V semiconductor channel layer are co-integrated on the same silicon substrate. In each of the figures, a top view is shown on the right-hand side and a cross-section, taken along the dashed line drawn on the top view, on the left-hand side. The method comprises the following steps.

Step (1), shown in FIG. 1, comprises providing a silicon (e.g. Si(001)) substrate 1 having an insulation layer 2 (e.g. STI) on top and a trench 3 extending through the insulation layer 2 and into the silicon 1. The trench may for example be V-shaped and may for example be formed by an etch process with a wet chemical, e.g. tetramethylammonium hydroxide (TMAH).

Figure 2:
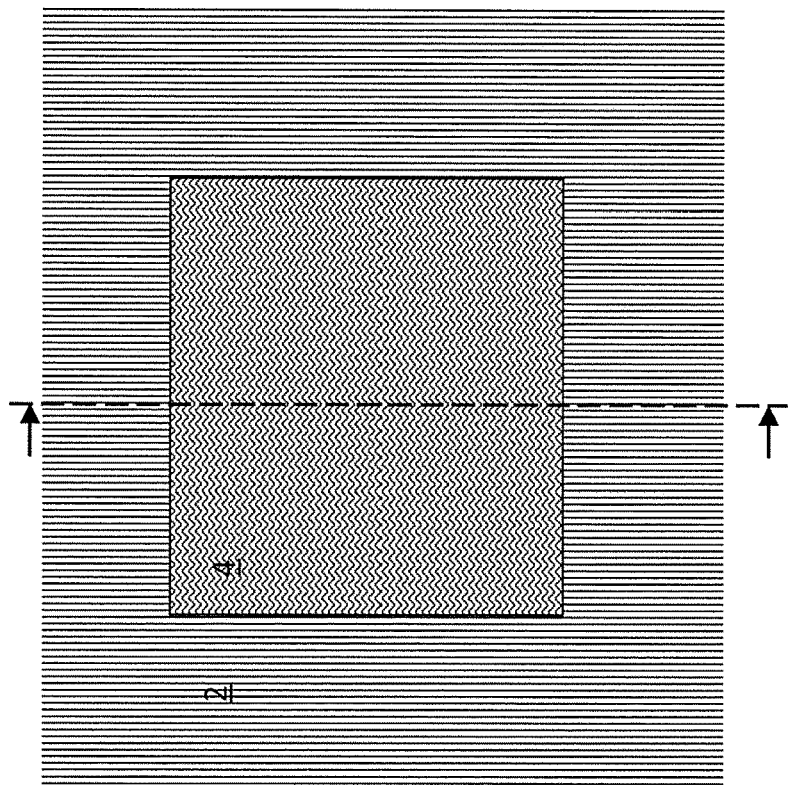
Figure 2:
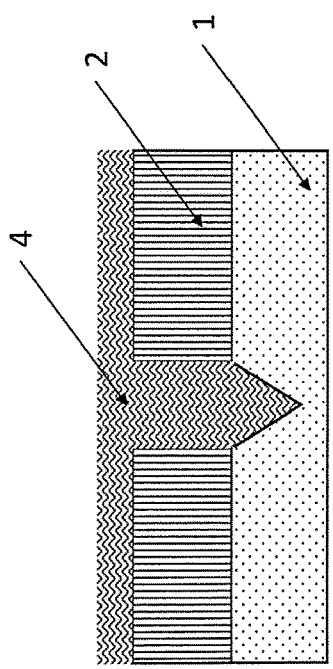

Step (2), shown in FIG. 2, comprises depositing a first dummy layer 4 of a sacrificial material (e.g. a-Si, deposition e.g. at 540° C.) on top of the insulation layer and in the trench, planarizing the first dummy layer (e.g. by chemical-mechanical polishing, CMP) and patterning the first dummy layer to restrict it to the area shown using a dry etch (e.g. reactive ion etching, RIE).

Figure 3:
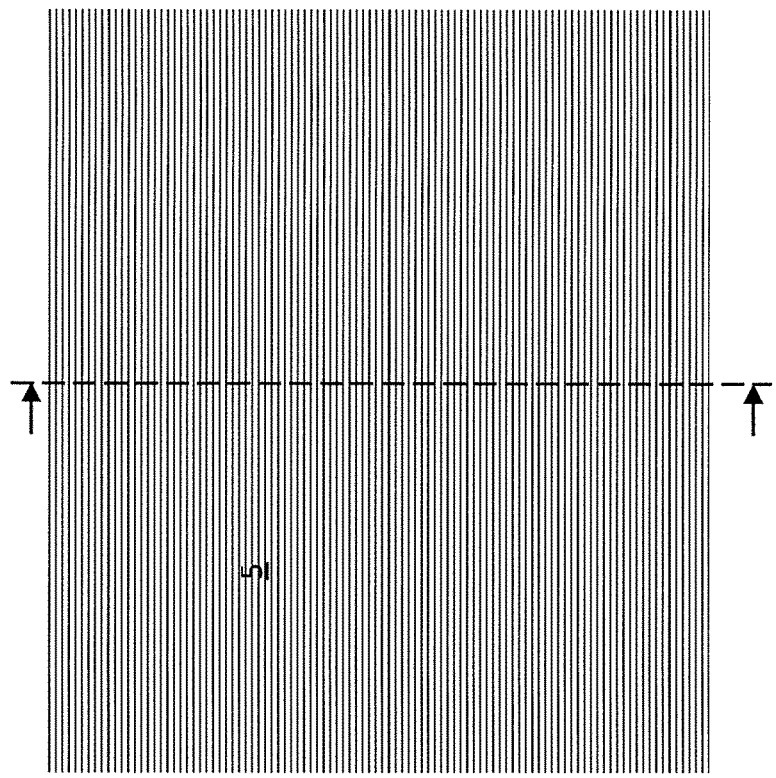
Figure 3:
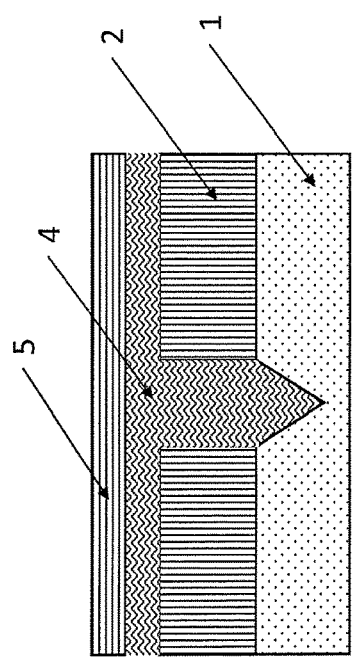

Step (3), shown in FIG. 3, comprises depositing a first oxide layer 5 on the planarized first dummy layer 4 and over the substrate. This can for example be done with Plasma Enhanced Atomic Layer Deposition (PEALD) at 300° C.

Figure 4:
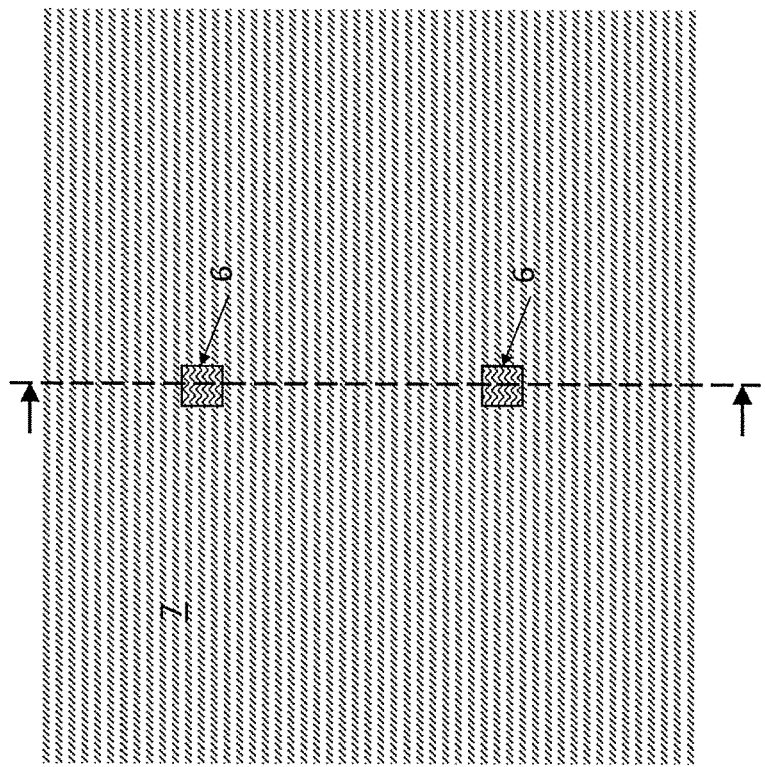
Figure 4:
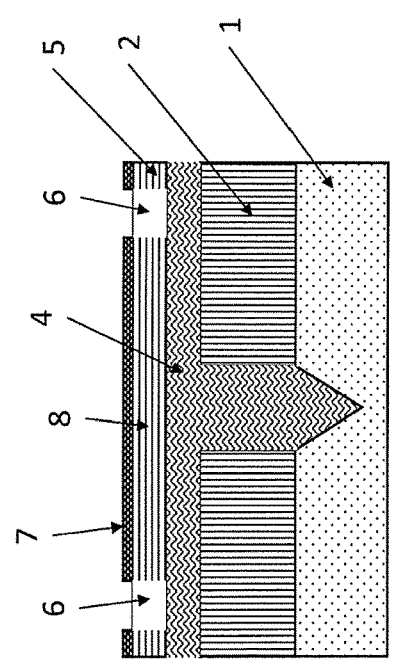

Step (4), shown in FIG. 4, comprises creating first openings 6 in the first oxide layer 5 up to the first dummy layer 4, for example by patterning a resist 7 and oxide etching with a dry etch (e.g. RIE). The first openings 6 are offset from the trench by a predetermined distance, such that a cover part 8 of the first oxide layer remains which covers the trench 3 and extends sideways therefrom over the predetermined distance.

Figure 5:
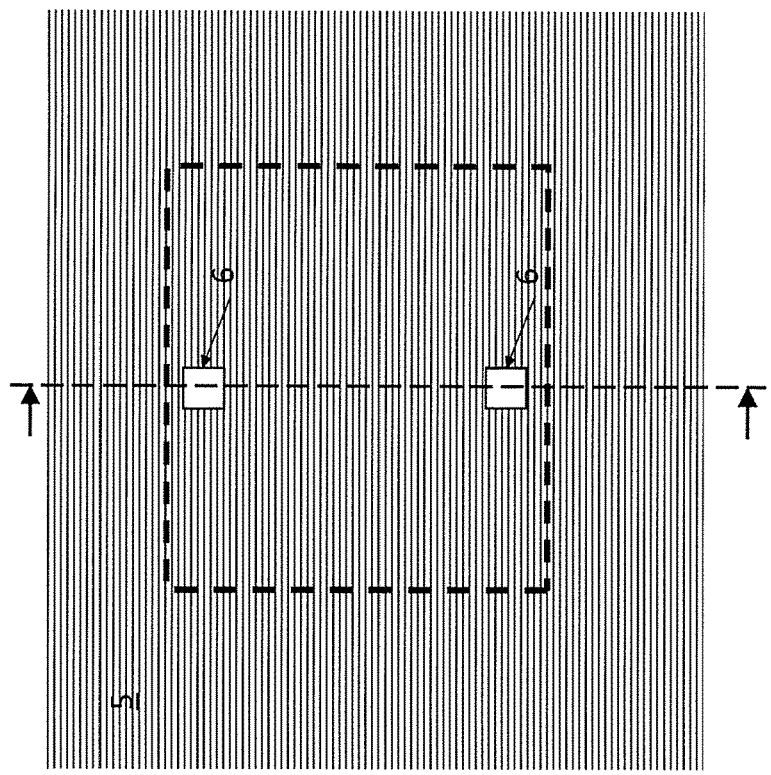
Figure 5:
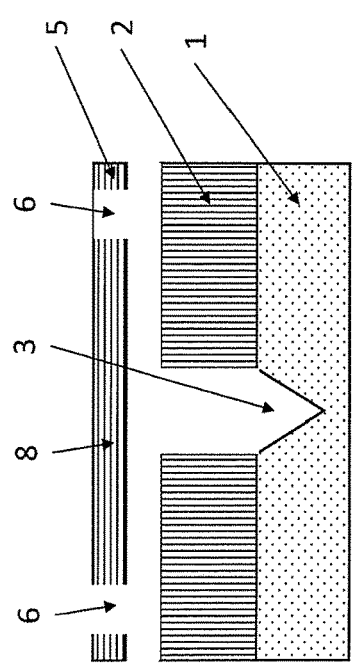

Step (5), shown in FIG. 5, comprises performing an etch process via the first openings 6 (e.g. removal of a-Si with wet chemical, e.g. TMAH), whereby the first dummy layer 4 is removed and the silicon substrate 1 is again exposed at the bottom of the trench 3. This creates a first cavity for growing the first channel material in the next step, which cavity extends up to the bottom of the trench, i.e. into the substrate 1, and comprises an area indicated with the dashed line on the top view on the right (corresponding to where the first dummy layer was located).

Figure 6:
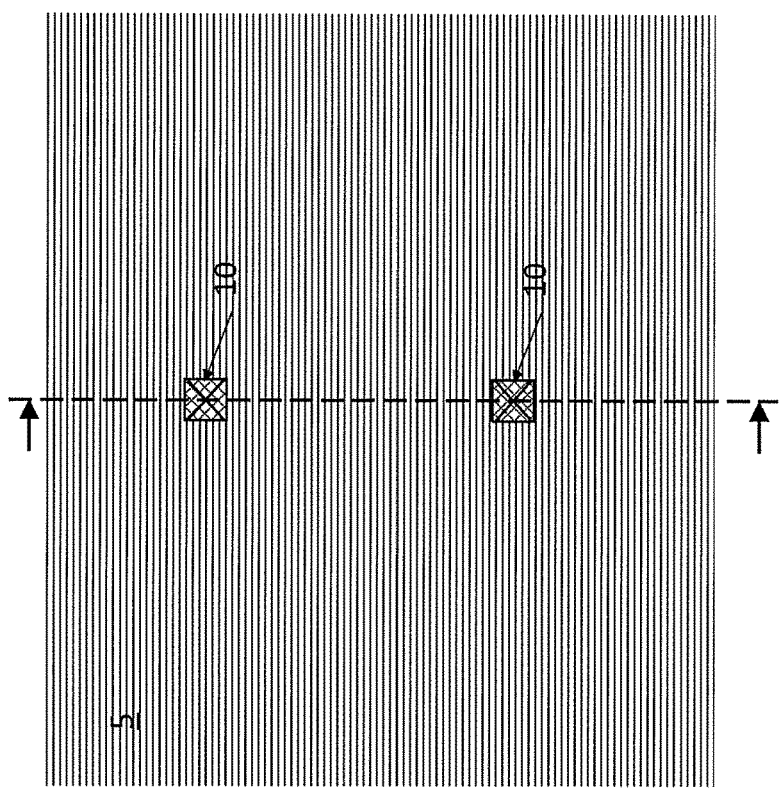
Figure 6:
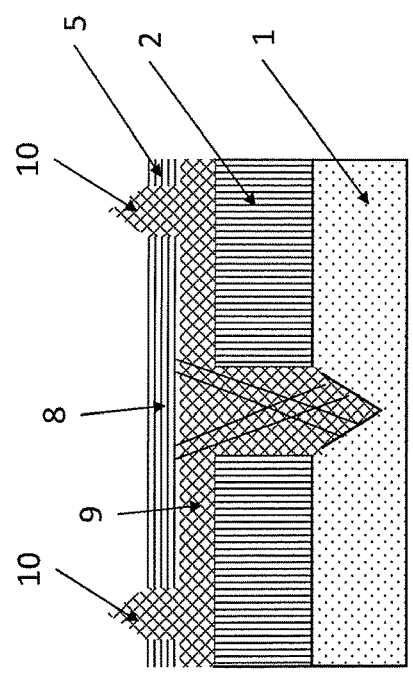

Step (6), shown in FIG. 6, comprises filling the first cavity with a III-V semiconductor material 9 (e.g. InGaAs or InP) by means of a selective area growth process (e.g. using Metal Organic Chemical Vapor Deposition, MOCVD). The cover part 8 of the first oxide layer 5 forces lateral growth. The crossing lines in the material in the trench indicate material defects, which are confined to this part of the material as a result of the forced lateral growth. Due to some overgrowth, pyramid-shaped parts 10 arise, which may be subsequently be removed by CMP.

Figure 7:
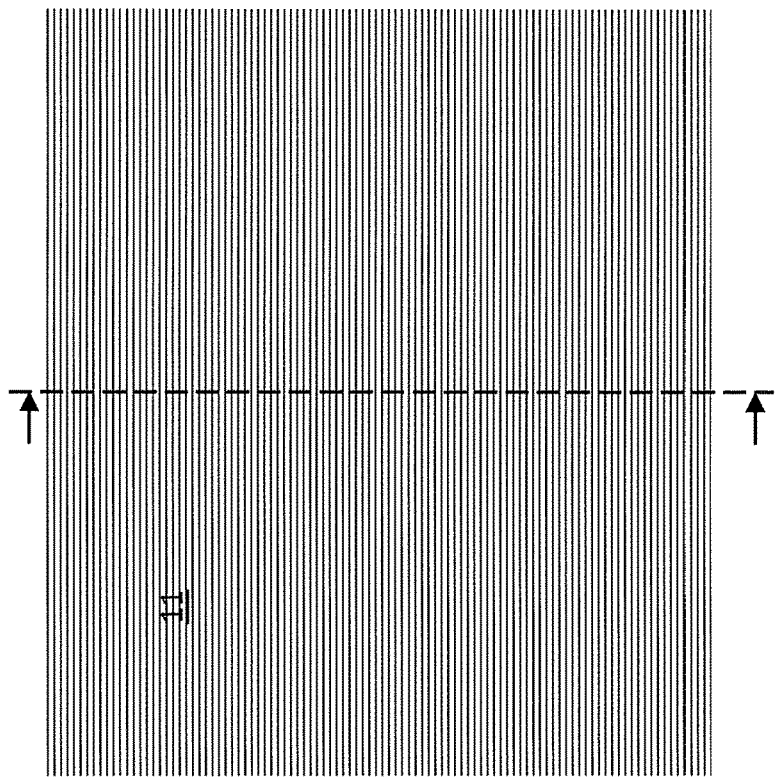
Figure 7:
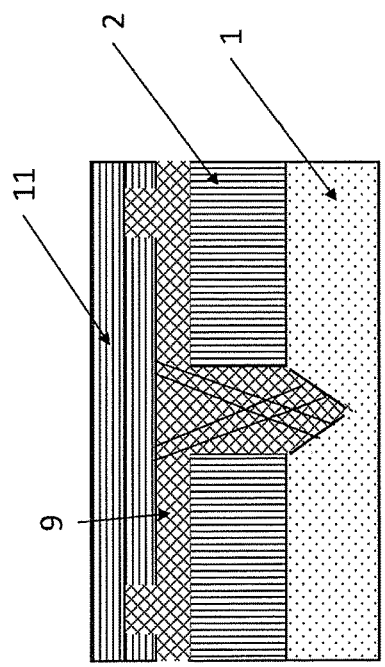

Step (7), shown in FIG. 7, comprises depositing a second oxide layer 11 on the planarized top surface, for example with PEALD at 300° C.

Figure 8:
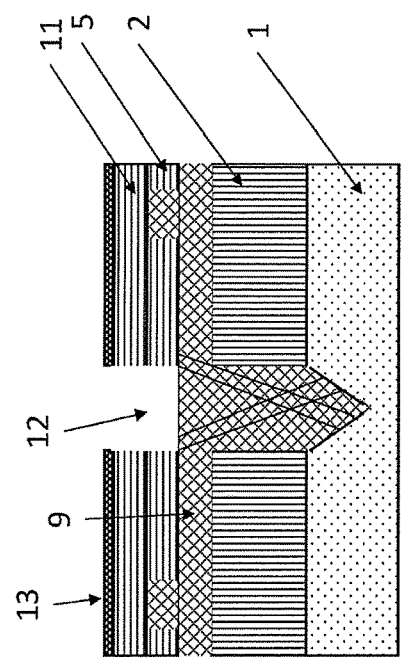
Figure 8:
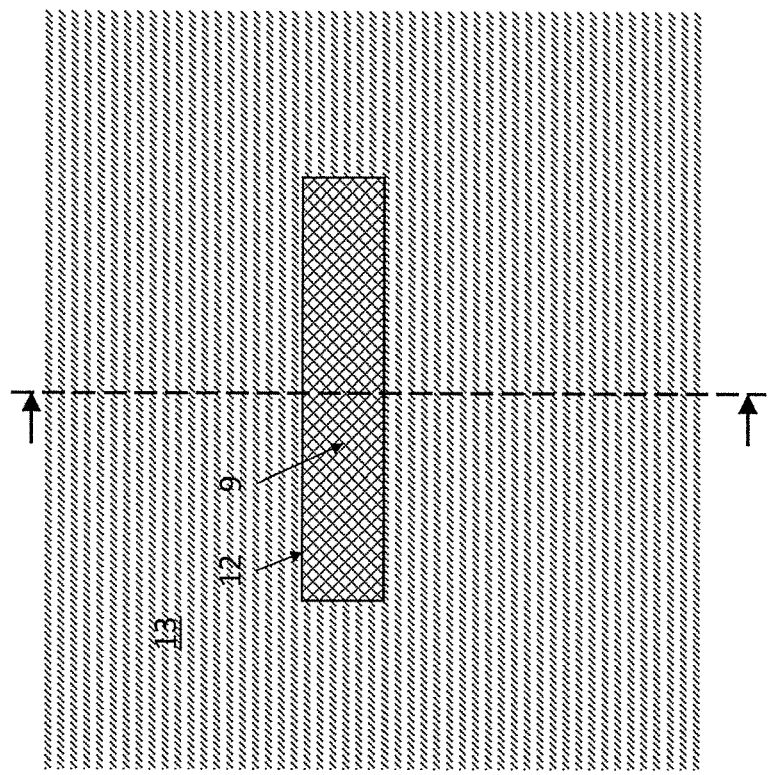

Step (8), shown in FIG. 8, comprises creating a second opening 12 through the first and second oxide layers 5, 11 by patterning with resist 13 and oxide etching (e.g. RIE), the second opening 12 being located above (and aligned with) the trench 3 and extending up to the III-V semiconductor material 9.

Figure 9:
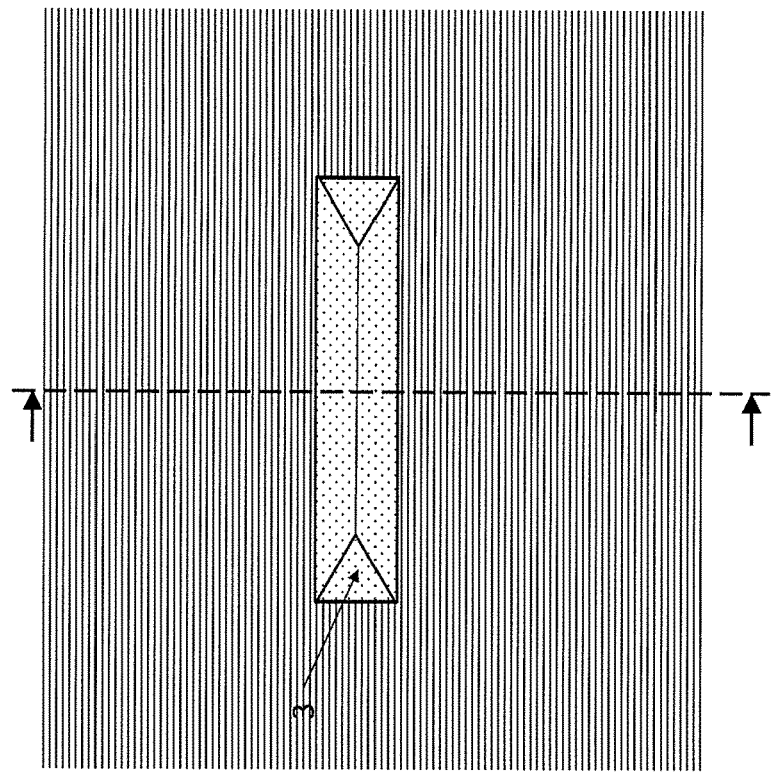
Figure 9:
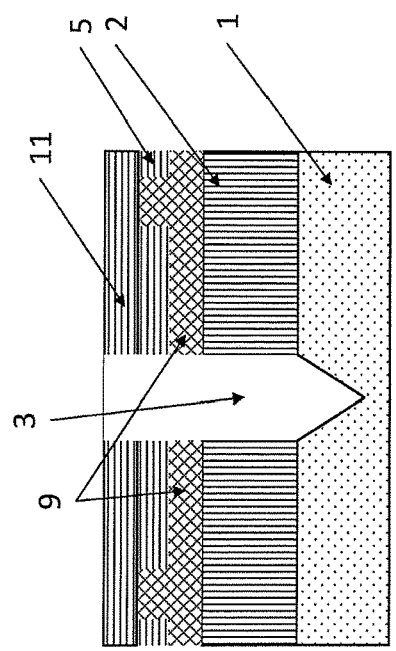

Step (9), shown in FIG. 9, comprises removing the III-V semiconductor material above and in the trench by means of a dry etching process (e.g. RIE) via the second opening.

Figure 10:
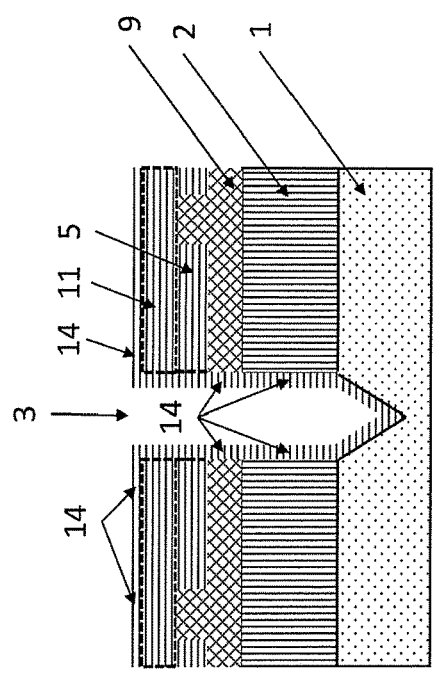
Figure 10:
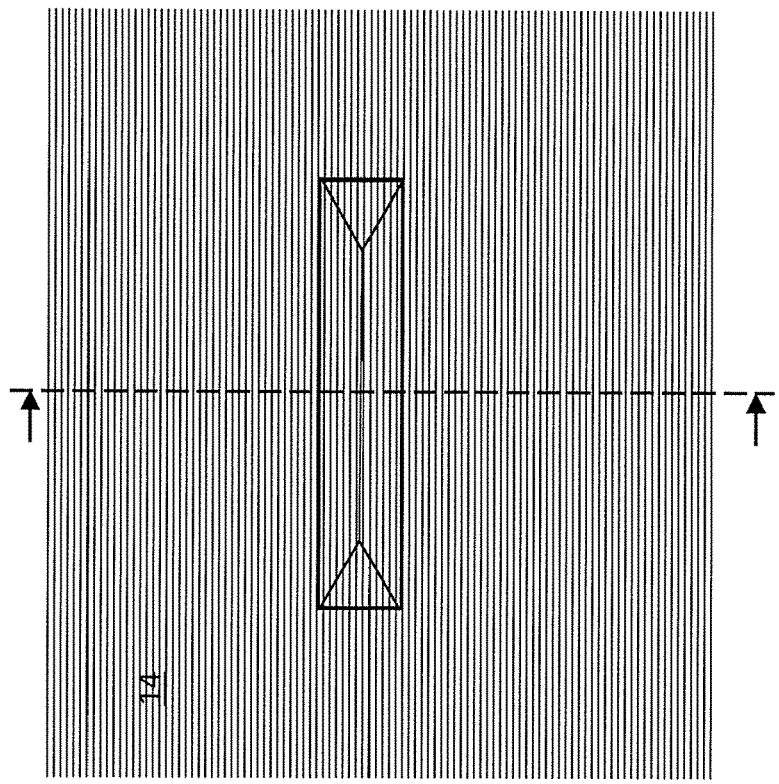

Step (10), shown in FIG. 10, comprises deposition of an oxide liner 14 (e.g. PEALD at 300° C.) all over the substrate. The purpose is to provide isolation at lateral sides of the III-V semiconductor material 9, which are exposed at the trench after step (9). The first oxide layer 5, the second oxide layer 11 and the oxide liner 14 together form a second insulation layer 15 in the resulting devices.

Figure 11:
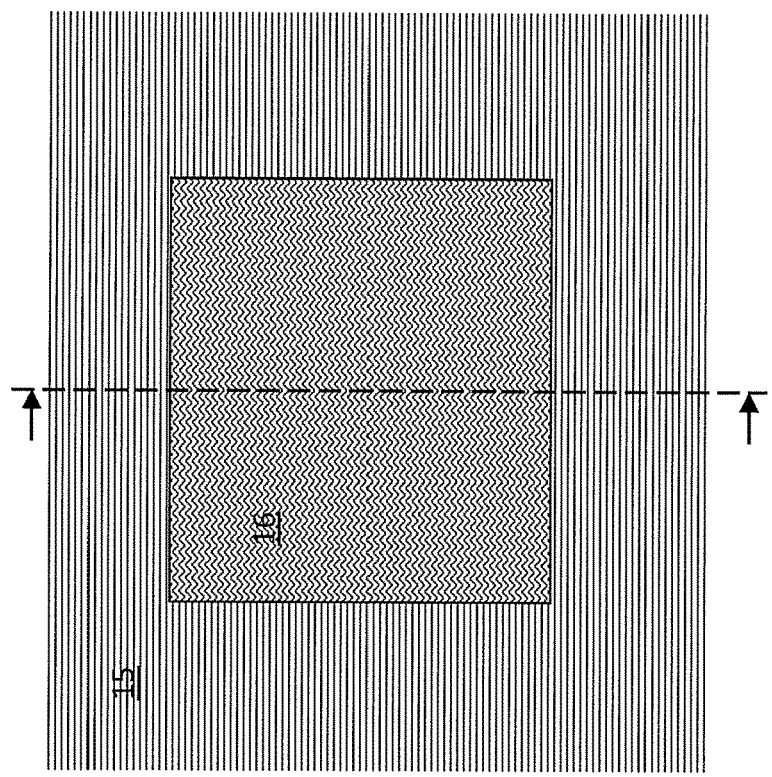
Figure 11:
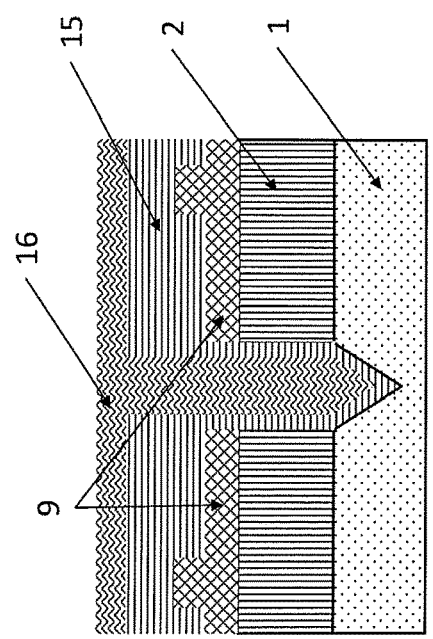

Step (11), shown in FIG. 11, comprises depositing a second dummy layer 16 of a sacrificial material (e.g. a-Si, deposition e.g. at 540° C.) above the oxide layers/second insulation layer 15 and in the trench 3, planarizing the second dummy layer (e.g. by chemical-mechanical polishing, CMP) and patterning the first dummy layer to restrict it to the area shown using a dry etch (e.g. reactive ion etching, RIE).

Figure 12:
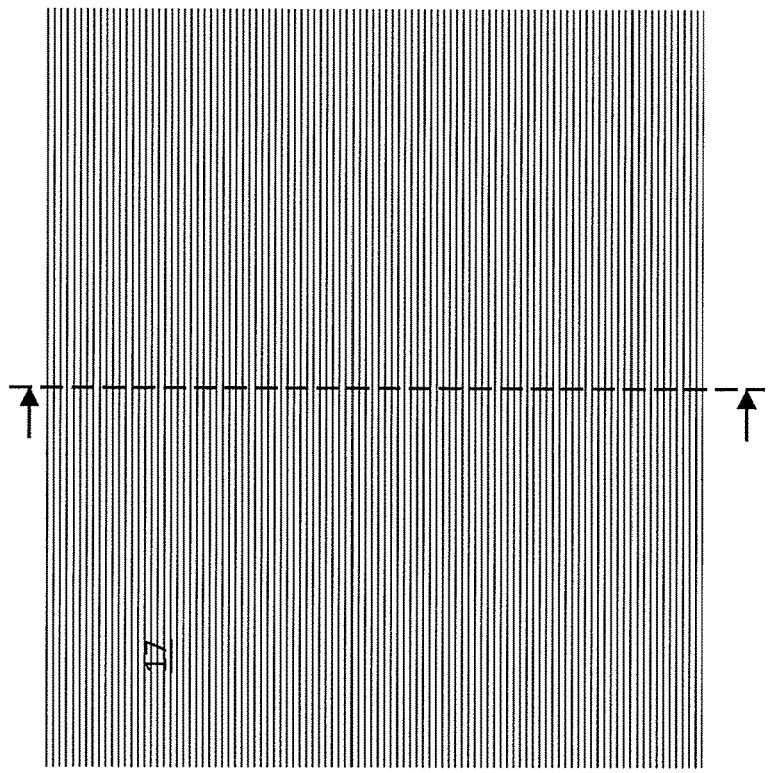
Figure 12:
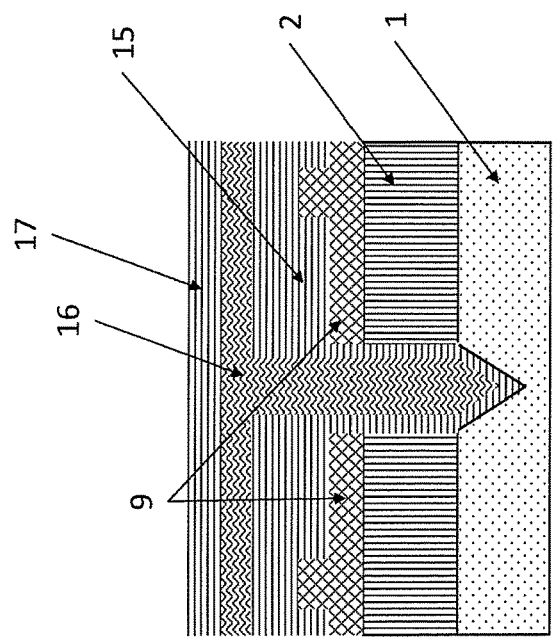

Step (12), shown in FIG. 12, comprises depositing a third oxide layer 17 on the planarized second dummy layer 16 and over the substrate. This can for example be done with Plasma Enhanced Atomic Layer Deposition (PEALD) at 300° C.

Figure 13:
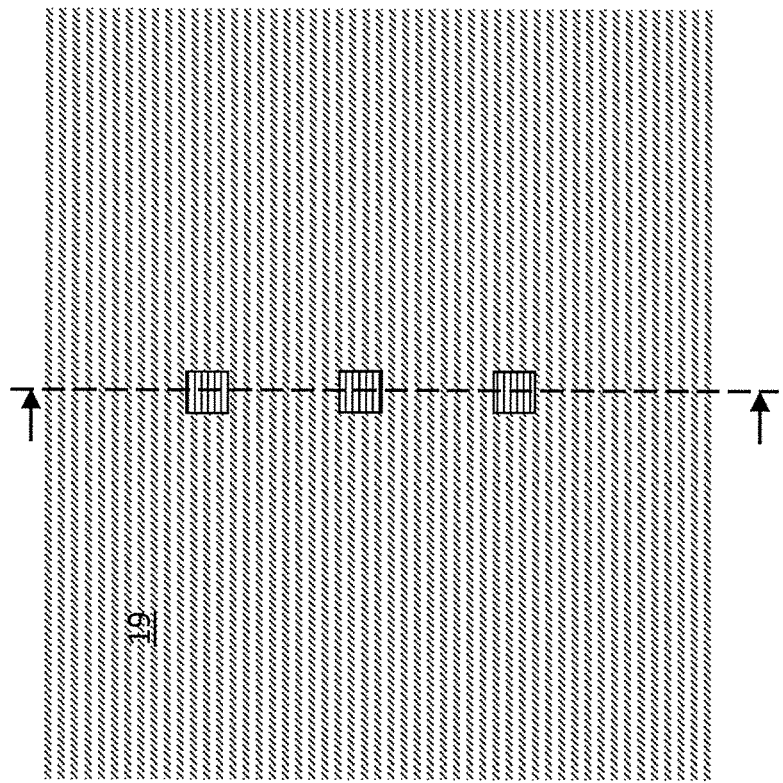
Figure 13:
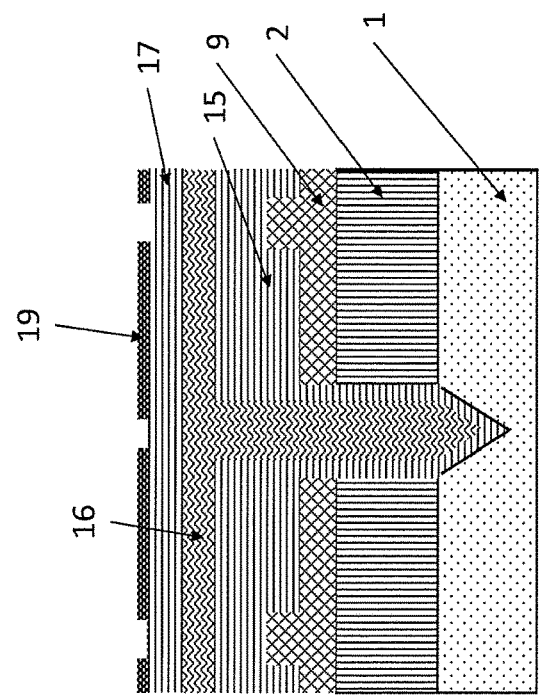
Figure 14:
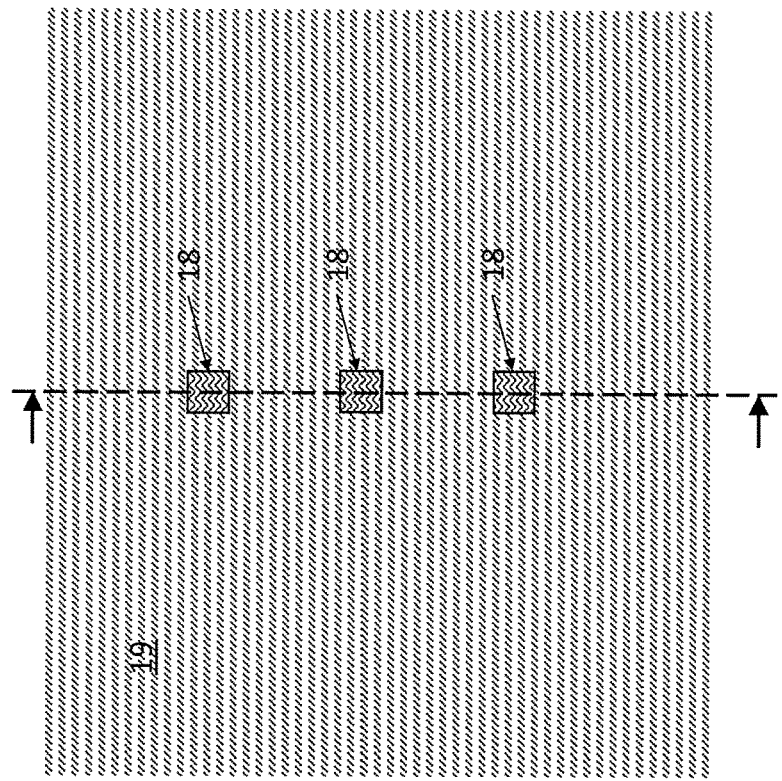
Figure 14:
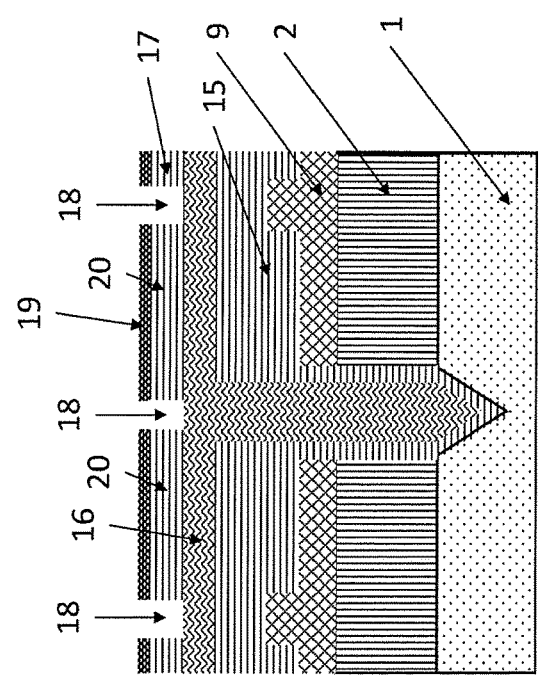

Steps (13)-(14), shown in FIGS. 13-14, comprise creating third openings 18 in the third oxide layer 17 up to the second dummy layer 16, for example by patterning a resist 19 and oxide etching with a dry etch (e.g. RIE). The third openings 18 are located above and offset from the trench such that cover parts 20 of the third oxide layer are left on either side of the trench. Preferably the offset third openings are aligned with the location of the first openings of step (4).

Figure 15:
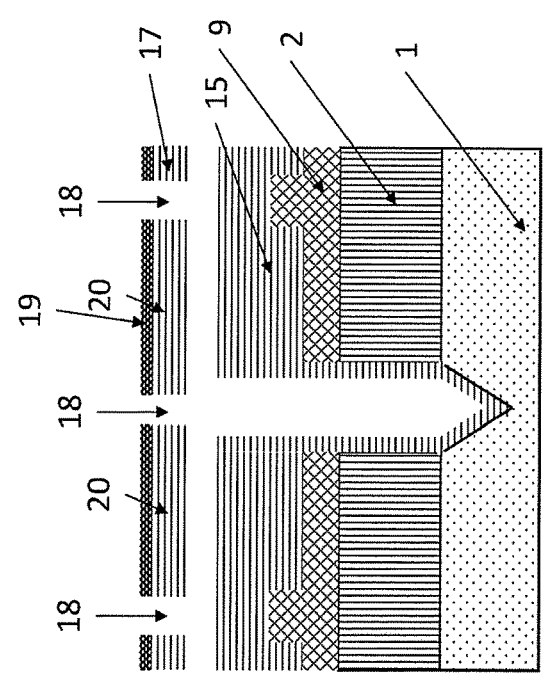
Figure 15:
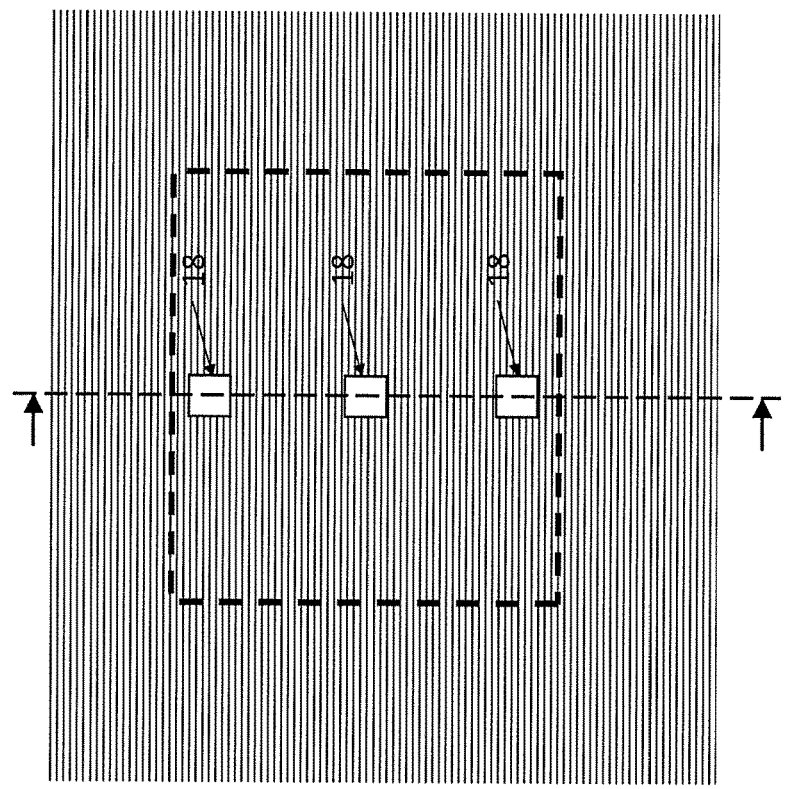

Step (15), shown in FIG. 15, comprises removing the second dummy layer 16 by etching via the third openings 18 (e.g. removal of a-Si with wet chemical, e.g. TMAH). This creates a second cavity for the second material in a following step. The cavity extends into the trench and comprises an area indicated with the dashed line on the top view on the right (corresponding to where the second dummy layer was located).

Figure 16:
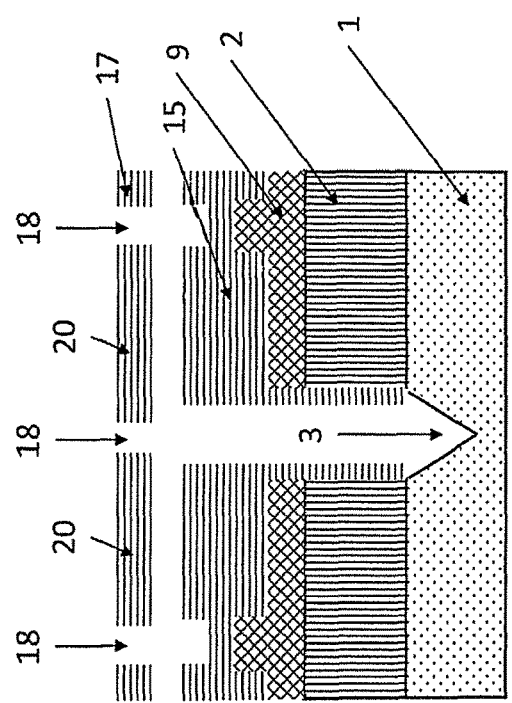
Figure 16:
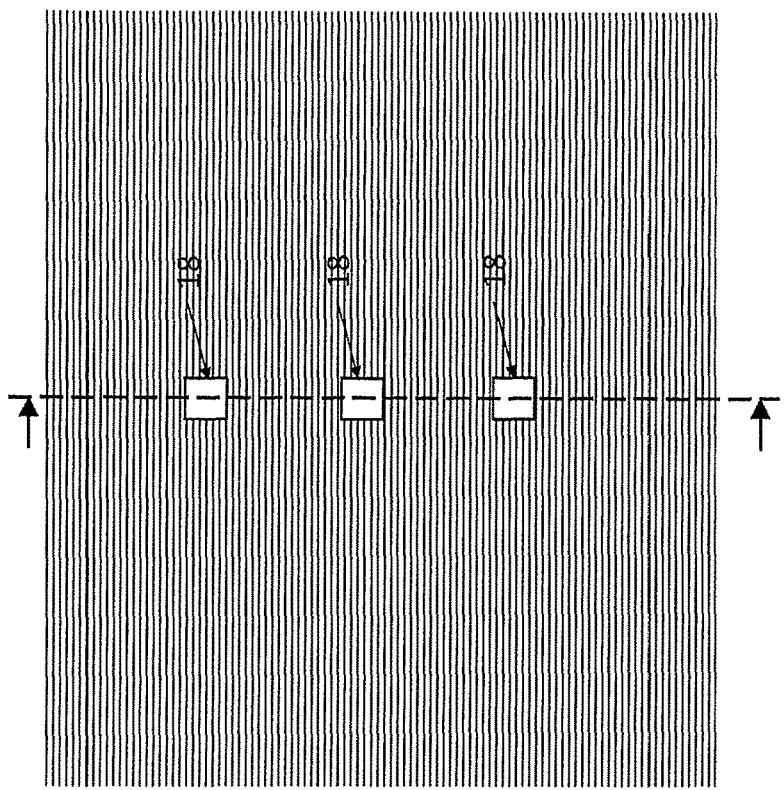

Step (16), shown in FIG. 16, comprises removing part of the oxide liner present at the bottom of the trench 3 by means of a wet etching process (e.g. TMAH) via the hole above the trench, to expose the silicon again.

Figure 17:
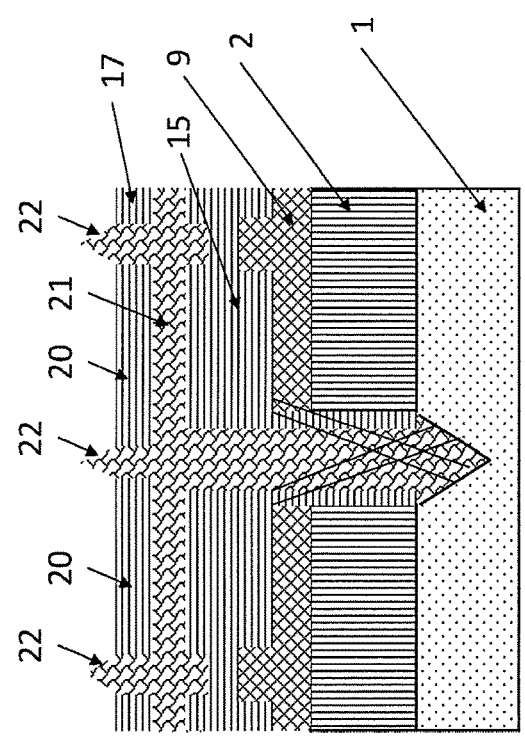
Figure 17:
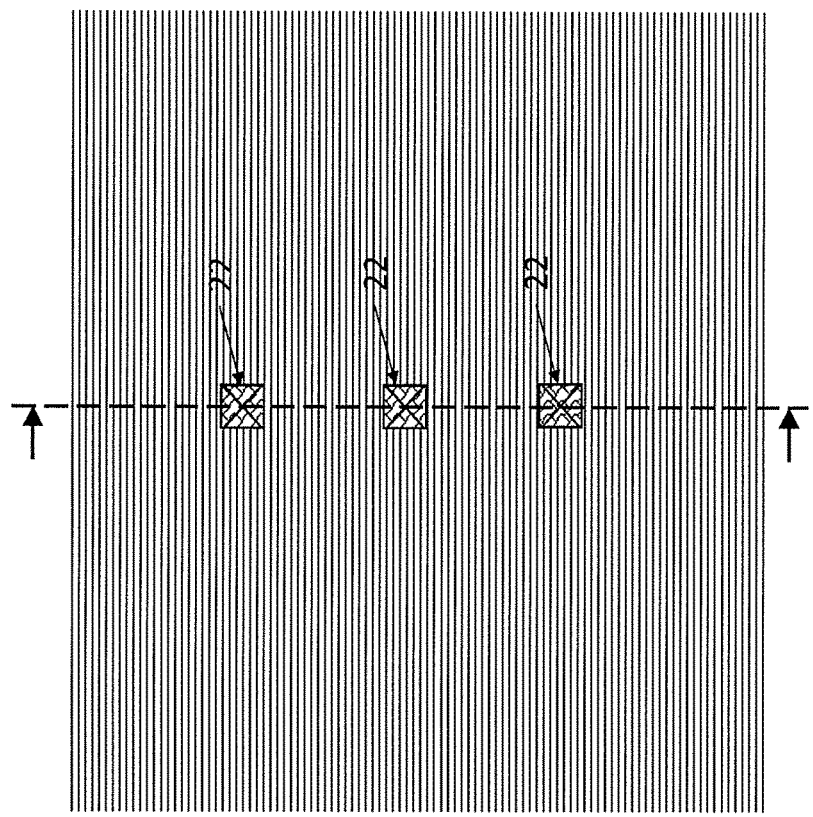
Figure 18:
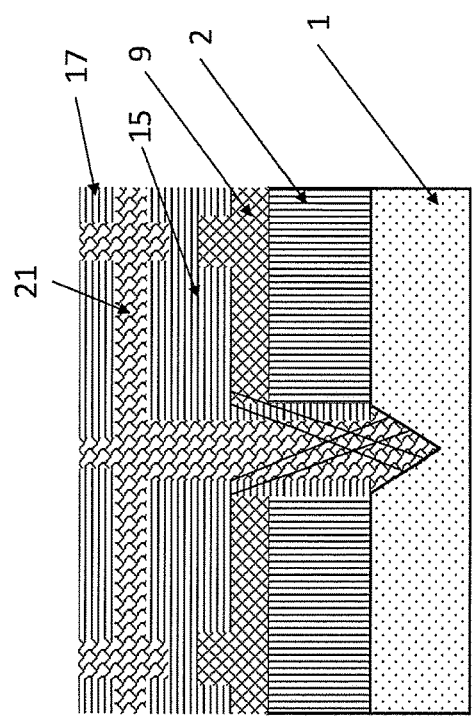
Figure 18:
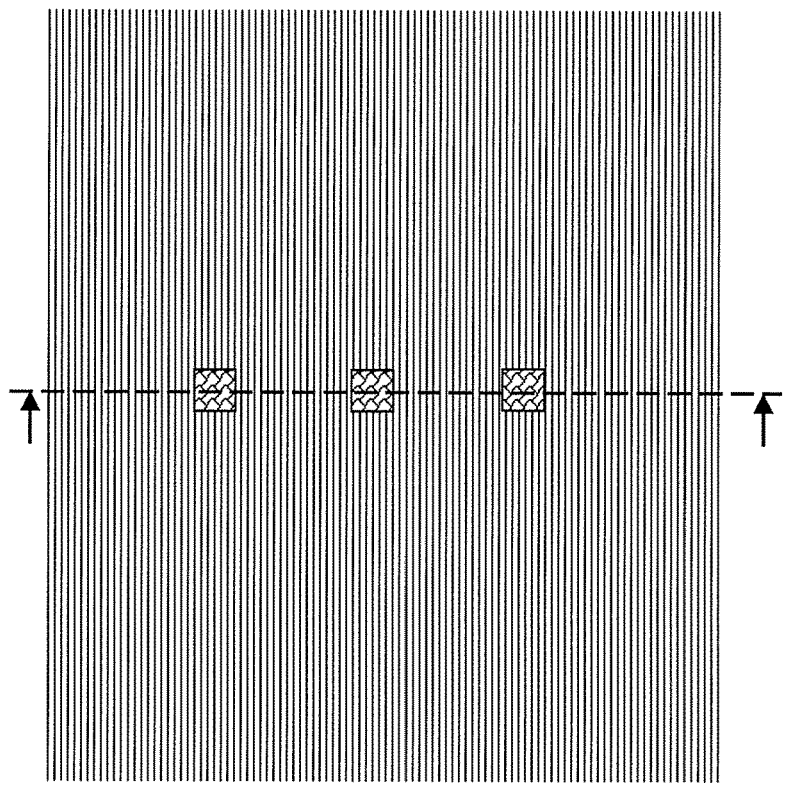

Step (17), shown in FIG. 17, comprises filling the second channel space with (silicon-) germanium 21 by means of a selective area growth process, wherein the cover parts 20 of the third oxide layer force lateral growth. The crossing lines in the material in the trench indicate material defects, which are confined to this part of the material as a result of the forced lateral growth. Due to some overgrowth, pyramid-shaped parts 22 arise, which may be subsequently be removed by CMP which is step (18) shown in FIG. 18.

The structure obtained after step (18) comprises stacks on either side of the trench with III-V semiconductor 9 and (silicon-)germanium 21 channel layers stacked above each other, separated by oxide insulation layers 15, 17. By means of subsequent etching steps, these stacks can be separated and for example made into fins, see FIG. 19, following which source, drain and gate structures can be added using standard CMOS processes known to the person skilled in the art. Because, as has been described above, material defects have been confined to the trench part of the material, which is etched away, the resulting stacks are defect-free and hence can have enhanced electrical performance.

Figure 19:
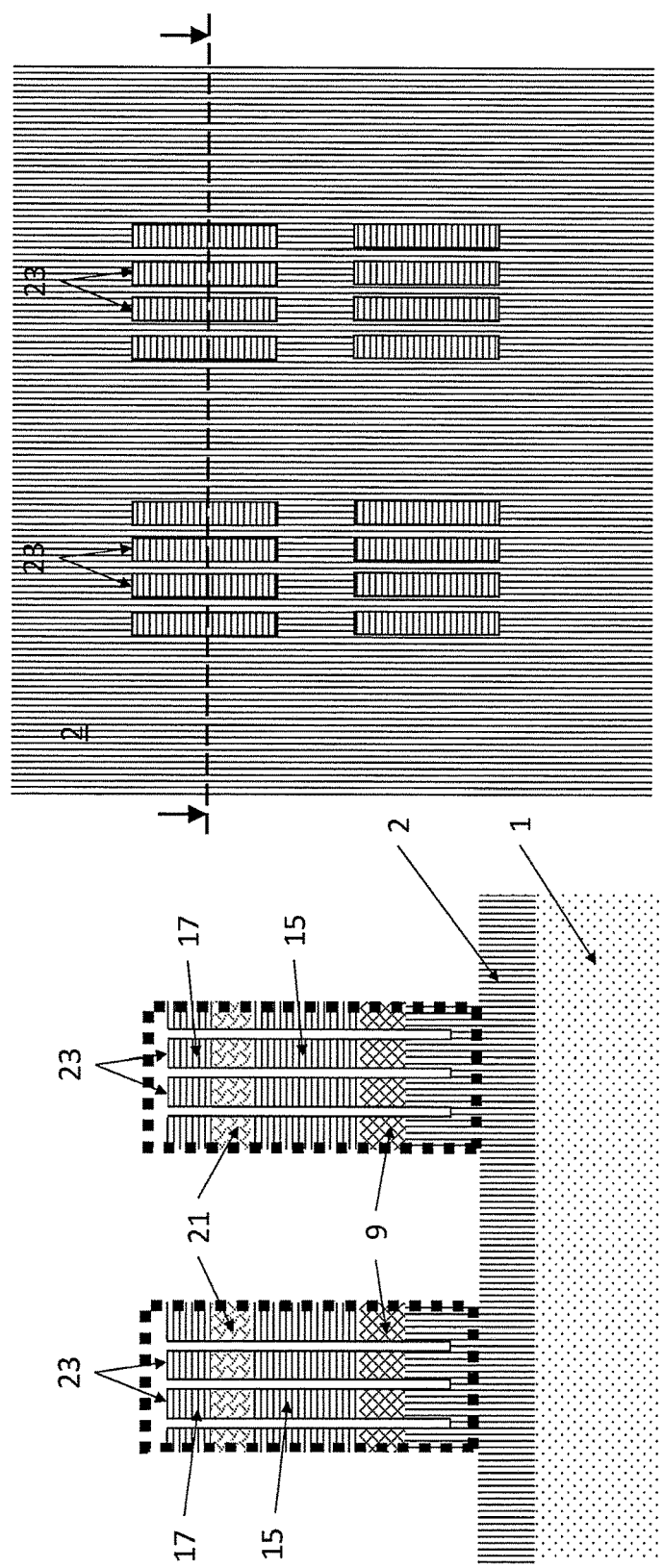
Figure 20:
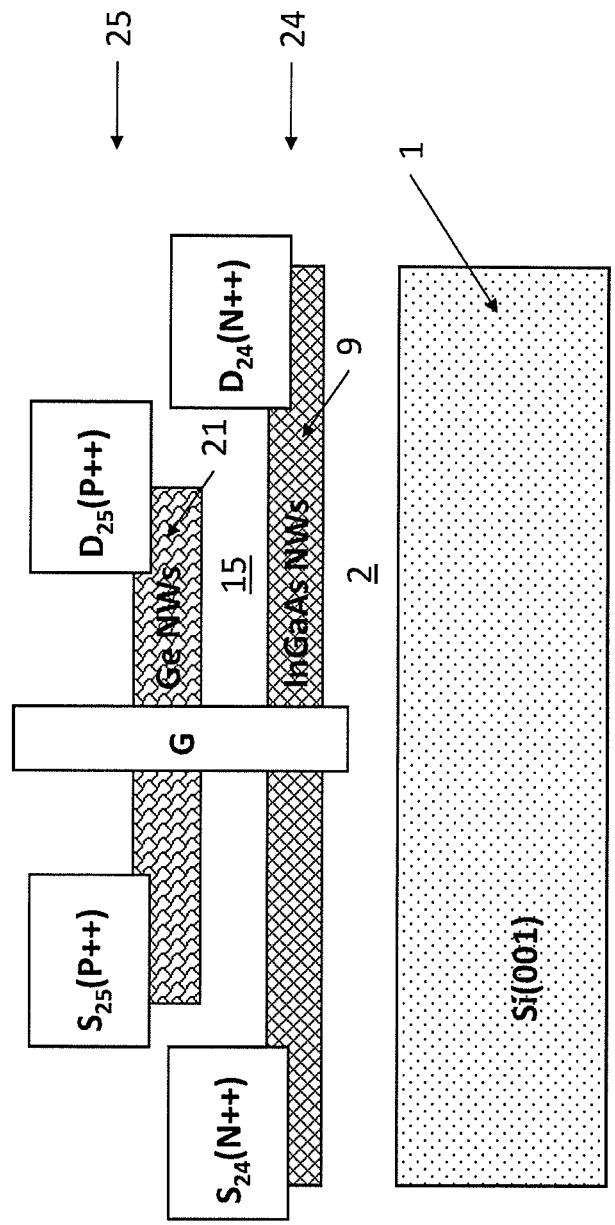
FIGS. 20 and 21 schematically show embodiments of devices obtainable with a method according to the present disclosure.

An example of a resulting device is schematically shown in FIG. 20, which shows a cross-sectional view through one of the fins 23 of the structure obtained in FIG. 19 after the further standard CMOS manufacturing steps for manufacturing source, drain and gate structures. The thus obtained device comprises a silicon substrate 1 having a first insulation layer 2 on top and a plurality of fins 23 extending upwards from the first insulation layer, each fin comprising a stack of layers of uniform thickness, wherein the stack comprises a III-V semiconductor channel layer 9 above the first insulation layer, a second insulation layer 15 above the III-V semiconductor channel layer 9 and a (silicon-) germanium channel layer 21 above the second insulation layer 15, wherein each fin further comprises sources $S_{24}$, $S_{25}$, drains $D_{24}$, $D_{25}$ and a common gate G of an nMOS device 24 and a pMOS device 25. Since the fins 23 are separate from each other as shown in FIG. 19, each fin 23 of the thus obtained device comprises an individual nMOS device 24 and an individual pMOS device 25 which are stacked above each other and which are separate from the other fins 23, i.e. separate from the stacked nMOS and pMOS devices of the other fins. This stacked configuration of the structures with individual devices in each fin can strongly improve the layout efficiency, even to such an extent that the critical dimension of the structures becomes vertical rather than horizontal.

The first and second insulation layers may each consist of a single layer or comprise or be composed of multiple layers. For example, as described above the second insulation layer may be composed of multiple layers of the same oxide, e.g. silicon oxide. However, a combination of different dielectrics may also be used in embodiments according to this disclosure.

Figure 21:
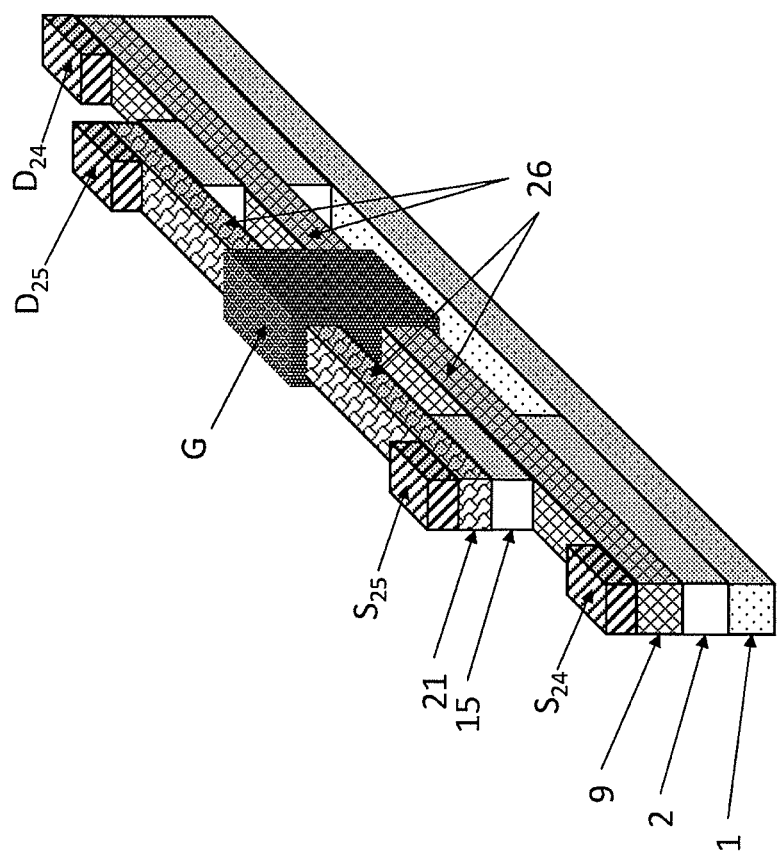

In embodiments according to this disclosure, an example of which is shown in FIG. 21, the first and second insulation layers 2, 15, or at least parts thereof may be removed in a middle section between the end sections of the fins where the sources $S_{24}$, $S_{25}$ and drains $D_{24}$, $D_{25}$ of the nMOS and pMOS devices 24, 25 are provided. This means that in this middle section the III-V semiconductor channel layer 9 and the germanium or silicon-germanium channel layer 21 are nanowires 26. In these embodiments, the common gate G can completely surround the nanowires 26, i.e. can be "wrapped around" the nanowires 26. In particular, like in the embodiment shown in FIG. 21, the common gate G can completely surround a middle part of the nanowires while maintaining a separation between the gate and end sections of the fins where the sources and drains are provided, so that the common gate G can remain isolated from the sources $S_{24}$, $S_{25}$ and drains $D_{24}$, $D_{25}$. In this way, the electrostatic properties of the devices can be further enhanced, since by wrapping the gate all around the nanowire, for example, gate leakage of the majority carriers can be prevented.

The invention claimed is:

1. A method for manufacturing a Si-based high-mobility CMOS device, wherein a Ge or $Si_xGe_{1-x}$ channel layer and a III-V semiconductor channel layer are co-integrated on a silicon substrate, the method comprising the steps of:
   a) providing a silicon substrate having a first insulation layer on top and a trench extending through the insulation layer and into the silicon;
   b) manufacturing a III-V semiconductor channel layer above the first insulation layer by means of, in sequence, depositing a first dummy layer of a sacrificial material above the first insulation layer and in the trench, covering the first dummy layer with a first oxide layer, and replacing the first dummy layer with III-V semiconductor material by etching the sacrificial material via first holes made in the first oxide layer followed by selective area growth with the III-V semiconductor material;
   c) manufacturing a second insulation layer above the III-V semiconductor channel layer and uncovering the trench; and
   d) manufacturing a germanium or silicon-germanium channel layer above the second insulation layer by means of, in sequence, depositing a second dummy layer of a sacrificial material above the second insulation layer and in the trench, covering the second dummy layer with a second oxide layer, and replacing the second dummy layer with germanium or silicon-germanium by etching the sacrificial material via second holes made in the second oxide layer followed by selective area growth with germanium or silicon-germanium.

2. The method according to claim 1, wherein the size and location of the first and second holes are chosen such that the first and second oxide layers have cover parts which force lateral growth during the selective area growth steps.

3. The method according to claim 2, wherein the first holes are made in the first oxide layer at locations offset from the location of the trench by a predetermined distance, such that a cover part of the first oxide layer remains which covers the trench and extends sideways therefrom over the predetermined distance.

4. The method according to claim 2, wherein the second holes comprise offset second holes, which are made in the second oxide layer at locations offset from the location of the trench by a predetermined distance, such that a cover part of the second oxide layer remains which extends from the location of the trench up to the offset second holes.

5. The method according to claim 4, wherein the second holes further comprise at least one non-offset second hole, which is made in the second oxide layer at a location aligned with the location of the trench.

6. The method according to claim 5, wherein the size of the non-offset second hole is smaller than the size of the offset second holes.

7. The method according to claim 1, wherein the trench has slanting side planes in the silicon substrate.

8. The method according to claim 1, further comprising planarization steps immediately following the dummy layer deposition steps and the selective area growth steps.

9. The method according to claim 1, wherein amorphous silicon is used as the sacrificial material for at least one of the first and second dummy layers.

10. The method according to claim 1, further comprising an oxide liner deposition step immediately following the step of uncovering the trench and a step of etching away the oxide liner at the bottom of the trench before the selective area growth with germanium or silicon-germanium.

11. The method according to claim 1, further comprising steps for forming stacked structures with layers of uniform thickness, each stacked structure comprising the III-V semiconductor channel layer and the germanium or silicon-germanium channel layer.

12. The method according to claim 11, further comprising steps for etching fins from the stacked structures and manufacturing in each fin sources, drains and a common gate for an nMOS device and a pMOS device, such that in each fin a separate nMOS device and pMOS device are formed which are stacked above each other.

* * * * *